(12) United States Patent
Govorkov et al.

(10) Patent No.: US 9,377,611 B2
(45) Date of Patent: Jun. 28, 2016

(54) LIGHT-SOURCE INCLUDING A PLANAR ARRAY OF DIODE-LASER BARS

(71) Applicant: Coherent, Inc., Santa Clara, CA (US)

(72) Inventors: Sergei Govorkov, Los Altos, CA (US); John H. Jerman, Palo Alto, CA (US)

(73) Assignee: Coherent, Inc., Santa Clara, CA (US)

( * ) Notice: Subject to any disclaimer, the term of this patent is extended or adjusted under 35 U.S.C. 154(b) by 158 days.

(21) Appl. No.: 14/279,804

(22) Filed: May 16, 2014

(65) Prior Publication Data

US 2015/0333483 A1 Nov. 19, 2015

(51) Int. Cl.
*G02B 27/09* (2006.01)
*H01S 5/40* (2006.01)
(Continued)

(52) U.S. Cl.
CPC .......... *G02B 19/0057* (2013.01); *G02B 6/4214* (2013.01); *G02B 19/0023* (2013.01); *G02B 27/0905* (2013.01); *G02B 27/0916* (2013.01); *H01S 5/024* (2013.01); *H01S 5/4012* (2013.01)

(58) Field of Classification Search
CPC ............ G01S 5/00; G01S 5/02; G01S 5/024; G01S 5/40; G01S 5/4012; G01S 5/4025; G01S 5/4075; G01S 5/42; G02B 6/00; G02B 6/0001; G02B 6/0005–6/0006; G02B 6/0066; G02B 6/0073; G02B 6/42; G02B 6/4201; G02B 6/4204; G02B 6/4206; G02B 6/4214; G02B 6/4236; G02B 6/4244; G02B 6/4295; G02B 6/4296; G02B 19/00; G02B 19/0004; G02B 19/0019; G02B 19/0023; G02B 19/0047; G02B 19/0052; G02B 19/0057; G02B 27/09–27/0916; G02B 27/0922; G02B 27/0977; G02B 27/14

USPC ................... 359/489.08, 618, 641, 838, 850, 359/855–857, 861; 362/551, 553–556, 253, 362/257, 259, 268, 296.01, 297, 298, 301, 362/296.09, 341, 346; 372/6, 29.02, 33, 36, 372/38.06, 43.01, 50.1, 50.12, 50.124
See application file for complete search history.

(56) References Cited

U.S. PATENT DOCUMENTS 3,917,406 A 11/1975 Siegler, Jr.
7,006,549 B2 * 2/2006 Anikitchev ............ G02B 27/09
372/107

(Continued)

FOREIGN PATENT DOCUMENTS

WO 2007/134645 A1 11/2007

OTHER PUBLICATIONS

International Search Report and Written Opinion received for PCT Application No. PCT/US2015/030541, mailed on Oct. 22, 2015, 20 pages.

(Continued)

*Primary Examiner* — Derek S Chapel
(74) *Attorney, Agent, or Firm* — Morrison & Foerster LLP (57) ABSTRACT

A light-source includes a planar array of diode-laser bars and a plurality of turning-mirrors arranged to stack beams from the diode-laser bars in the fast-axis direction to provide a first combined beam. Six plane mirrors are arranged to divide the combined beam into three beam-slices, each having one-third the slow-axis width of the first combined beam, and add the beam-slices in the fast-axis direction to provide a second combined beam having about one-third the slow-axis width and three-times the fast-axis length of those of the first combined beam. A spherical mirror and a cylindrical mirror focus the second combined beam into an optical fiber.

14 Claims, 5 Drawing Sheets

(51) Int. Cl.
  *G02B 19/00*   (2006.01)
  *H01S 5/024*   (2006.01)
  *G02B 6/42*    (2006.01)

(56) References Cited

U.S. PATENT DOCUMENTS

| 8,537,865 | B1 | 9/2013 | Shou |
| 8,602,592 | B2 | 12/2013 | Kuchibhotla et al. |
| 2004/0257661 | A1* | 12/2004 | Gao ............... G02B 27/095 |
| | | | 359/627 |
| 2009/0190218 | A1* | 7/2009 | Govorkov ......... B23K 26/0613 |
| | | | 359/489.08 |
| 2012/0133903 | A1 | 5/2012 | Tanaka |

OTHER PUBLICATIONS

Invitation to pay additional fees received for PCT Patent Application No. PCT/US2015/030541, mailed on Aug. 19, 2015, 6 pages.
Caprara et al., Unpublished U.S. Appl. No. 14/035,775, filed Sep. 24, 2013, titled "Beam Stacking Element for Diode-Laser Bar Stack".
Govorkov et al., Unpublished U.S. Appl. No. 14/221,152, filed Mar. 20, 2014, titled "Diode-Laser Bar Mounted on a Copper Heat-Sink", 10 pages.

* cited by examiner

LIGHT-SOURCE INCLUDING A PLANAR ARRAY OF DIODE-LASER BARS

TECHNICAL FIELD OF THE INVENTION

The present invention relates in general to light-sources (laser-radiation sources) for materials processing and optical pumping of high-power fiber-lasers and fiber amplifiers. The invention relates in particular to light-sources including arrays of diode-laser bars and delivering total power of about 1 kilowatt (KW) or greater.

DISCUSSION OF BACKGROUND ART

The term "diode-laser bar" is a term used by practitioners of the laser art to describe a linear array of spaced-apart diode-lasers (emitters) in a bar-like, single-crystal semiconductor substrate. The diode-lasers in the bar are characterized as having a propagation-axis (emission-axis), and fast- and slow-axes perpendicular to each other and perpendicular to the propagation-axis. An emitter emits in the fast-axis with a relatively high divergence, for example between about 20° and about 30° half-angle, compared with that of emission in the slow-axis, for example, about 5° half-angle.

A diode-laser bar generally has a length of about 10 millimeters (mm), a width of about between about 1 and 1.5 mm, and a thickness of about 100 micrometers (μm). Emitters are located in a diode-laser bar with the slow-axes of the emitters nominally aligned with each other in the length direction of the diode-laser bar. A common number of emitters in a 10-mm long diode-laser bar is nineteen. The diode-laser bar is typically characterized by a "fill-factor", which is the total of the widths of emitter apertures in bar divided by the length of the bar. In a diode-laser bar having twenty emitters of equal width, each emitter would have a width, i.e., a slow-axis dimension, of about 150 μm. The height (fast-axis dimension) of an emitting aperture is typically about 1.5 μm, i.e., 100-times less than the width.

In this background-art discussion, and in the detailed description of the present invention that follows, reference is made to a "beam-parameter product" (BPP). The BPP is a commonly used measure of quality of a laser-beam, and is the mathematical product of a beam-waist radius and the divergence half-angle of a beam into or out of the beam-waist. A typical unit of BPP for lasers beams is a millimeter-milliradian (mm·mr). A beam is deemed to have higher quality, the lower the BPP. The BPP is essentially independent of another commonly used measure of beam quality usually referred to as "brightness", which can be roughly described as the total intensity of radiation in a beam-waist area and solid angle.

It will be evident from the typical diode-laser-emitter aperture dimensions discussed above (effectively a beam-waist that is not rotationally symmetrical) that the slow-axis BPP of the exemplified emitter is about 15-times greater (worse) than the fast-axis BPP of the exemplified emitter. This ratio is amplified for a diode-laser bar by the number of emitters in the diode-laser bar, as the BPPs in any axis are additive.

A primary significance of BPP as a quality measure is that when focusing an individual beam, or a combined beam including a plurality of individual beams, into a circular aperture having a symmetrical (in mutually perpendicular transverse axes) numerical aperture (NA), the more symmetrical the BPP of the beam, the more the radiation, brightness being equal, that can be focused into that NA.

A circular aperture is typical of the core or cladding of an optical fiber. The high degree asymmetry of the BPP of radiation from a diode-laser bar has been a particular challenge for practitioners of the laser art desirous of focusing the radiation into an optical fiber having a doped core (a gain-fiber) for optical pumping purposes, or into an optical fiber having an un-doped core, for transport to a location at which the radiation will be used.

In optical pumping of high-power fiber lasers or laser material processing, more power is required than can be provided by a single diode-laser bar. To provide such a high power in a single source, use is made of stacks of diode-laser bars. A preferred type of diode laser bar stack diode-laser bar stack is a so-called "vertical" stack in which diode-laser bars are located "one above the other", i.e., stacked in the fast-axis direction, whatever the actual physical orientation of the stack may be. Such a stack is advantageous from the BPP symmetry point of view, inasmuch as the fast-axis BPP is increased by the fast-axis stacking, while the slow-axis BPP stays the same. Vertical stacks including up to 26 diode-laser bars are commercially available. Light-sources including such stacks typically require complicated beam-shaping and focusing including several refractive optical elements. A light-source including a plurality of vertical diode-laser bar stacks is described in U.S. Pat. No. 8,602,592, assigned to the assignee of the present invention, and the complete disclosure of which is hereby incorporated by reference.

For brightness considerations, or simply to reduce the total fast-axis dimension of a vertical stack, as close as possible a fast-axis spacing of the diode-laser bars is preferred. This complicates cooling arrangements for the diode-laser bars which are mounted on very thin shelves or sub-mounts extending from a common heat-sink. Typically, high-pressure micro-channel water-cooling is required. Such micro-channel cooling requires the use of de-ionized water to avoid corrosion problems in cooling channels. Other problems with such vertical diode-laser bar stacks include little practical flexibility to change the fast-axis separation or "pitch" of the diode-laser bars; practical inability to replace defective diode-laser bars; and difficulty of test and burn-in for individual diode-laser bars.

An alternative combination arrangement for diode-laser bars is to form a planar array of diode-laser bars on a surface of a common heat-sink. This allows close thermal contact of the diode-laser bars with the heat sink which can allow the replacement of high pressure micro-channel cooling with low-pressure macro-channel cooling. This combined with electrical isolation of the diode-laser bars from the macro-channel eliminates the need for de-ionized water, allowing normal mains water ("tap water") to be used.

Planar arrays of diode-laser bars may have the diode-laser bars arrayed along the propagation-axis direction, or along the slow-axis direction, spaced on the heat sink. Output-beams from the diode-laser bars are collimated in the fast-axis direction by a fast-axis collimating (FAC) lens, and subsequently in the slow-axis direction by slow-axis collimating (SAC) lens arrays. Various optical arrangements can be used to "stack" the beams from the diode-laser bars in the fast-axis direction to form a combined beam, which is focused by suitable focusing optics into an optical fiber.

One particular problem with planar diode-laser arrays is that the optical distance from each diode-laser bar to the focusing optics is different, typically increasing from a shortest distance to a longest distance. Because of the inherently poor beam quality from a diode-laser bar and limitations of the FAC and SAC collimating optics, among other factors, the beams cannot be perfectly collimated. This is particularly true in the slow-axis direction.

A result of this is that the slow-axis length of the diode-laser bar beams at the focusing optics would be different for each beam. Accordingly, the cross-section of the combination of the diode-laser bar beams at the focusing optics would not-have parallel sides in the fast-axis direction, which is a less than ideal condition for filling the NA of an optical fiber. This problem, of course can be mitigated by limiting the number of diode-laser bars in a planar array, but, total power limitation aside, such limitation reduces the degree to which above-discussed BPP asymmetry can be reduced by fast-axis stacking of beams from the diode-laser bars. There is a need for planar diode-laser array light-sources which allow for improvement of BPP symmetry in combined beams presented to focusing optics.

SUMMARY OF THE INVENTION

In one aspect, optical apparatus in accordance with the present invention comprises an optical fiber and a planar array of diode-laser-bar modules each thereof emitting a beam of laser-radiation. Each of the beams is characterized as having a fast-axis, a slow-axis, and a propagation-axis perpendicular to each other. A first plurality of turning-mirrors is arranged to cause the beams from the diode-laser bars to propagate parallel to each other, aligned in the slow-axis direction, and spaced apart in the fast-axis direction to form a first combined beam having a fast-axis length and a slow-axis width. A second plurality of mirrors is arranged to divide the first combined beam into a plurality of beam-slices, each thereof having a slow-axis width less than that of the first combined beam, and add the beam-slices in the fast-axis direction to form a second combined beam having a slow-axis width less than that of the first combined beam. Anamorphic focusing optics are arranged to focus the second combined beam into the optical fiber. The anamorphic focusing optics have optical power for the slow-axis direction greater than that for the fast-axis direction of the second combined-beam.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
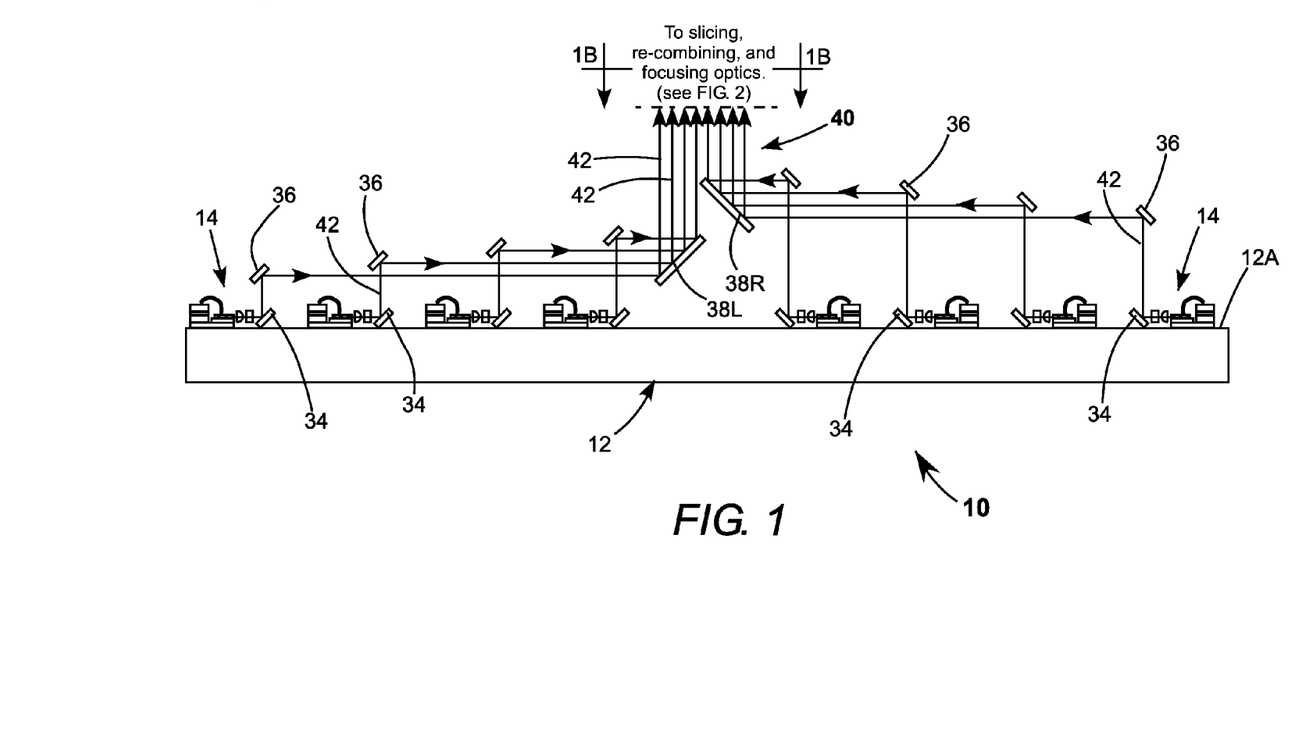
FIG. 1 schematically illustrates a planar diode-laser bar array for a light-source in accordance with the present invention, including first and second sets of four diode-laser bar modules, spaced apart on a planar heat-sink in the propagation-axis direction with slow-axes of the diode-laser bars parallel to each other, with the first and second sets of diode-laser bars emitting toward each other in the propagation-axis direction, and with a plurality of turning-mirrors arranged to stack beams from the diode-laser bars in the fast-axis direction to form a combined beam directed away from the planar heat-sink.
Figure 1A:
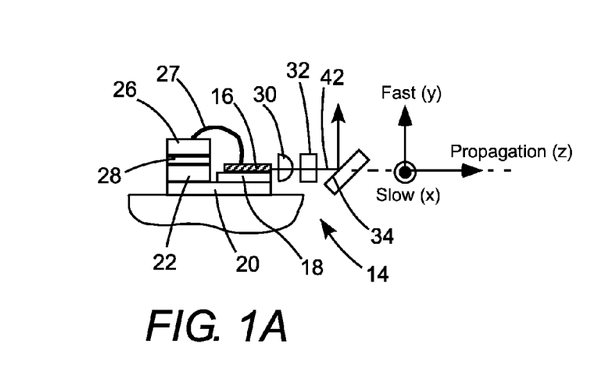
FIG. 1A schematically illustrates detail of a diode-laser bar module in the planar diode-laser array of FIG. 1

Referring now to the drawings, wherein like components are designated by like reference numerals, FIG. 1 and FIG. 1A schematically illustrates a planar diode-laser bar array 10 for a light-source in accordance with the present invention. Planar array 10 includes eight diode-laser bar modules 14 on surface 12A of a planar heat-sink 12. The diode-laser bars are characterized by a fast-axis, a slow-axis, and a propagation-axis (see FIG. 1A) as discussed above.

Diode-laser bar modules 14 are spaced apart in the propagation-axis direction with slow-axes of the diode-laser bars parallel to each other. Here each diode-laser bar module includes a diode-laser bar 16 on a thermally and electrically conductive sub-mount 18. Sub-mount 18 is bonded on a thermally conductive, electrically insulating plate 20, which is bonded in turn to the heat sink. A positive electrode 22 is bonded on plate 20 and a negative electrode 26 is bonded on positive electrode 22 by a layer of glass-filled epoxy 28. Electrical contact of negative electrode 26 with diode-laser bar 16 is made by a plurality of leads 27, only one of which is shown in the drawings.

A more detailed description of diode-laser bar "packaging" (mounting) on a heat-sink is not necessary for understanding principles of the present invention, and, accordingly, is not presented herein. A detailed description of the packaging arrangement of FIG. 1A is provided in U.S. patent application Ser. No. 14/221,152, filed Mar. 20, 2014, assigned to the assignee of the present invention, and the complete disclosure of which is hereby incorporated herein by reference. Other diode-laser bar packaging arrangements may be used without departing from the spirit and scope of the present invention.

Continuing with reference to FIGS. 1 and 1A, each diode-laser bar module 14 includes a fast-axis collimating (FAC)

lens 30 and a slow-axis collimating (SAC) lens array 32. On emerging from SAC array 32, collimated beams from each emitter in diode-laser bar are about contiguous in the slow-axis direction and can be considered as a single combined beam 42 (depicted in FIGS. 1 and 1A by a single principal ray thereof).

Each beam 42 is intercepted by a turning-mirror 34 and directed away from heat sink 12, here, in the fast-axis direction of the diode-laser bar modules. The fast-axis directed beams are intercepted, in turn, by corresponding turning-mirrors 36. Mirrors 36, here re-direct beams 42 in the propagation-axis direction parallel to each other, with a left-hand four of the beams propagating from left to right, and a right-hand four of the beams propagating, in an opposite direction, from right to left.

The right-hand four of beams 42 are intercepted by a single turning-mirror 38R. The left-hand four of beams 42 are intercepted by a single turning-mirror 38L. The individual heights of mirrors 36 and the propagation-axis position and incidence angle of mirrors 38R and 38L are selected such that the eight beams 42 are optically "stacked" in the fast-axis direction to form a single combined beam 40, a cross-section of which is depicted in FIG. 1B.

The spacing or "pitch" P between beams 42 in beam 40 is selected, consistent with the fast-axis height of the beams, such that the beams are about contiguous with each other in the fast-axis direction. The diode-laser bar modules are aligned with each other in the propagation-axis direction such the beams 42 are aligned with each other in the propagation-axis-direction. Combined beam 40 has about eight-times the fast-axis BPP of a beam 42 and about the same slow-axis BPP.

In the arrangement of FIG. 1, the heights of the left-situated and right-situated mirrors 36 are increased progressively, such that beams 42 in the center of beam 40 travel the shortest distance to the combination-plane and beams 42 at the extremities of beam 42 travel the longest distance. As the slow-axis dimension of the beams increases with distance traveled this imparts a certain "barrel-distortion" to the cross-section of the combined beam. This, however, is about one-half of what the distortion would be if all eight beams 42 propagated in the same direction before being contiguously combined, and is instrumental in reducing the effective slow-axis BPP of the combined beam. The effective slow-axis BPP, here, being considered as being determined by the longest slow-axis length of any beam 42.

Figure 1B:
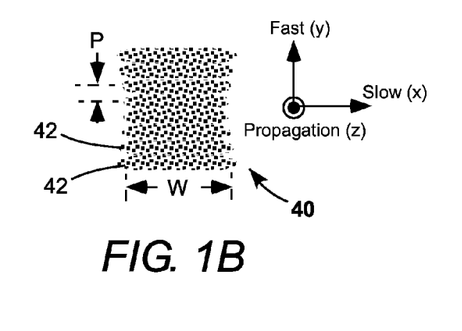
FIG. 1B schematically illustrates a cross-section of the combined beam seen generally in the direction 1B-1B of FIG. 1.

In FIG. 1B, the slow-axis width W of the combined beam can be considered as the average slow-axis width of the component beams 42. It should be noted that the heights of mirrors 36 can be less symmetrically arranged to provide an alternate cross-section of beam 40 with apparently less distortion. An example of this is discussed further herein below. It should also be noted that while the left and right four diode-laser bar modules are depicted in FIG. 1 as pointing toward each other, all to the diode-laser bar modules can be pointed in the same direction, with the counter-propagation of the right and left sets of four beams 42 achieved by suitable orientation of the turning-mirrors.

Figures 2, 2A, 2B, 2C:
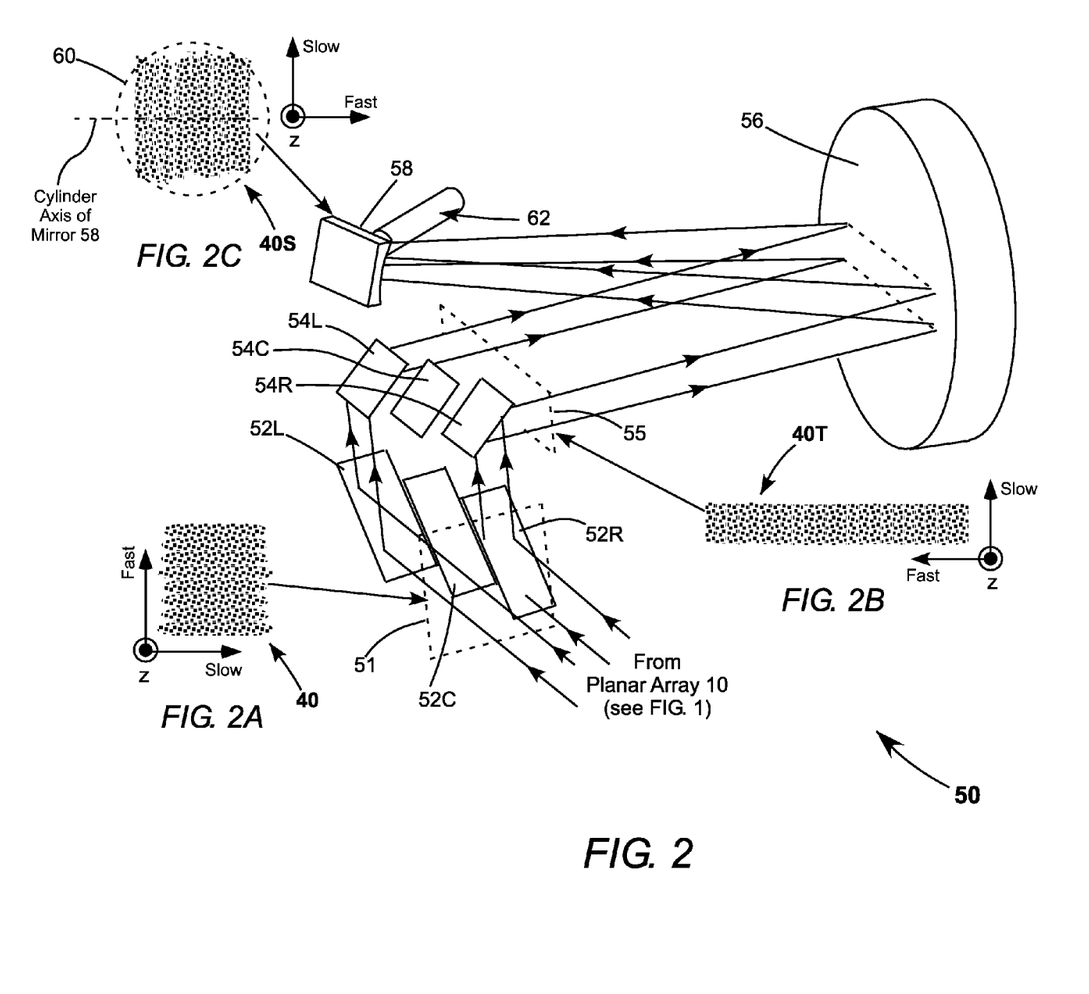
FIG. 2 is a three-dimensional view schematically illustrating slow-axis beam-slicing, beam-recombining, and focusing optics in a preferred embodiment of a light-source in accordance with the present invention utilizing the planar diode-laser bar array of FIG. 1, the focusing optics including a spherical concave mirror followed by a cylindrical concave mirror.
FIG. 2A schematically illustrates a cross-section of a combined beam similar to that of FIG. 1B entering the slow-axis beam-slicing and recombining optics of FIG. 2.
FIG. 2B schematically illustrates a cross-section of the beam of FIG. 2A following slicing and recombination by the beam-slicing and recombination optics of FIG. 2.
FIG. 2C schematically illustrates a cross section of the slow-axis sliced and recombined beam at the cylindrical mirror of FIG. 2.

FIG. 2 schematically illustrates slow-axis beam-slicing, beam-recombining, and focusing optics in a preferred embodiment 50 of a light-source in accordance with the present invention utilizing planar diode-laser bar array 10 of FIG. 1. The optics can be considered collectively as beam-shaping and focusing optics. A first part of the beam-shaping function of the optics is performed by turning-mirror pairs 52R and 54R, 52C and 54C, and 52L and 54L.

Combined beam 40, depicted in cross-section in FIG. 2A is intercepted by turning-mirrors 52R, 52C, and 52L which are staggered along the propagation-axis direction of beam and sized and located such that beam 40 is divided in the slow-axis direction into three "slices" of equal slow-axis width. These slices are intercepted by mirrors 54R, 54C, and 54L which are arranged to recombine and align the 52R, 52C and 52L slices contiguously in the fast-axis direction to form a combined beam 40T. Beam 40T is depicted in cross-section in FIG. 2B and has three-times the fast-axis BPP and one-third the slow-axis BPP of beam 40, i.e., twenty-four-times the fast-axis BPP and one-third the slow-axis BPP of an original beam 42 from a diode-laser bar module 14 in FIG. 1.

Beam 40T is directed to a spherical concave mirror 56 which converges the beam onto a concave cylindrical (power in one transverse-axis only) mirror 58, for eventual focusing into an optical fiber 62. This compresses the beam much more in the fast-axis direction than in the slow-axis direction to provide a nearly shape-symmetrical beam cross-section 40S on mirror 58. This is depicted in FIG. 2C wherein the cylinder-axis of mirror 58 (the axis in which optical power is zero) is depicted as being aligned with the fast-axis direction of beam 40S. Also depicted, in phantom, in FIG. 2C is a projection 60 of a circle on mirror 58 corresponding to the NA of optical fiber 62. Mirror 58 has a focal length about 10 times less than that of mirror 56, which, in the axis arrangement depicted in FIG. 2C, serves to about match the divergence in the slow-axis and the fast-axis of the beam focused into fiber 62. Mirrors 56 and 58 can be collectively referred to as anamorphic reflective focusing optics having greater optical power in the slow-axis than in the fast-axis of an input-beam.

It should be noted here that fiber 62 is depicted in only a short length in FIG. 2 for convenience of illustration. Fiber 62 may be a gain fiber-laser with small core diameter relative to that of the cladding and the light being focused into the cladding. Fiber 62 may also be a multimode transport-fiber with a cladding having a core-diameter much larger than the cladding thickness and with the light focused into the cladding. In either case, there may be some particular damage-resistant coupling arrangement on the fiber tip such as end cap or the like, as is known in the art.

In a calculated practical example of embodiment 50, for 10 mm diode-laser bars each having a 30% fill factor, and with fiber 62 having a NA 0.22 and a diameter of 500 μm, beam 40 had a fast-axis height of about 12 mm and a slow-axis width of about 12 mm. Mirror 56 had a focal length of about 100 mm and mirror 58 had a focal length of about 10 mm. Mirrors 56 and 58 were axially separated by about 90 mm. The beam focused from mirror 58 into fiber 62 had a slow-axis BPP between about 1.5 and 2.0 times the BPP in the fast-axis. In practice, this ratio is influenced by deviation from perfect slow-axis alignment of emitters in the diode-laser bars. This deviation is whimsically referred to as "smile" by practitioners of the art.

The above discussed exemplary dimensions should not be considered as limiting the present invention. Those skilled in the art may choose other focal lengths and separations without departing from the spirit and scope of the present invention. Examples may be calculated using commercially available optical design software such as ZEMAX available from the Zemax Corporation of Bellevue, Wash.

Figure 3:
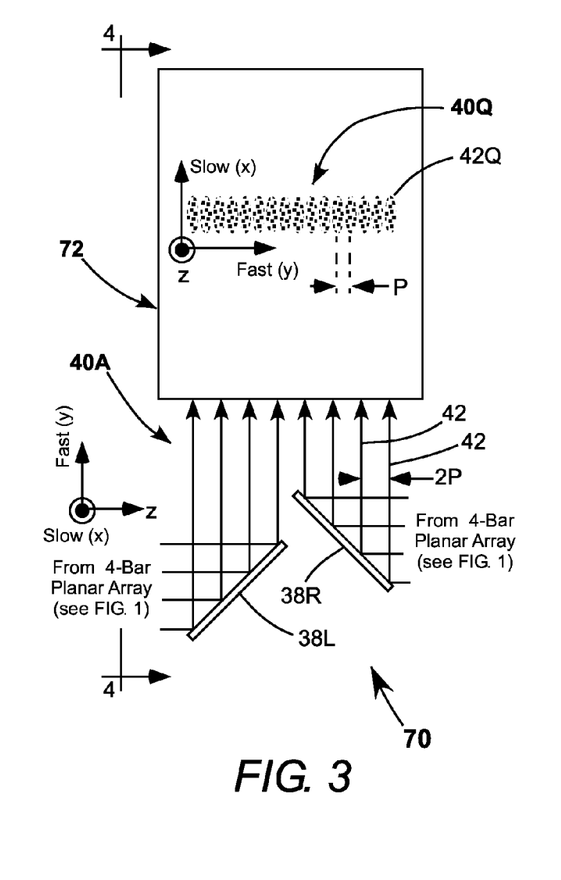
FIG. 3 is a side-elevation view schematically illustrating another preferred embodiment of a light-source in accordance with the present invention similar to the embodiment of wherein the slow-axis beam-slicing and fast-axis beam recombination optics of FIG. 2 are replaced by slow-axis beam-slicing and slow-axis recombination optics followed by a monolithic slow-axis beam-slicing and fast-axis interleaving element.

FIG. 3 is a side-elevation view schematically illustrating another embodiment 70 of a light-source in accordance with the present invention. Here the planar diode-array (only partially depicted) is arranged to provide a combined beam 40A, wherein eight individual beams 42 are separated in the fast-axis by a distance (2P), i.e., twice the distance P required for the beams to be about contiguous. The total fast-axis length of beam 40A is twice that of beam 40 of light-source 10 of FIG.

1. Beam 40A is delivered to a beam-slicing and interleaving unit 72. Unit 72 creates a combined beam 40Q having a slow-axis width about one-quarter that of input-beam 40A with sixteen component beams 42Q stacked about contiguously in the fast-axis direction.

Figures 4, 4A, 4B:
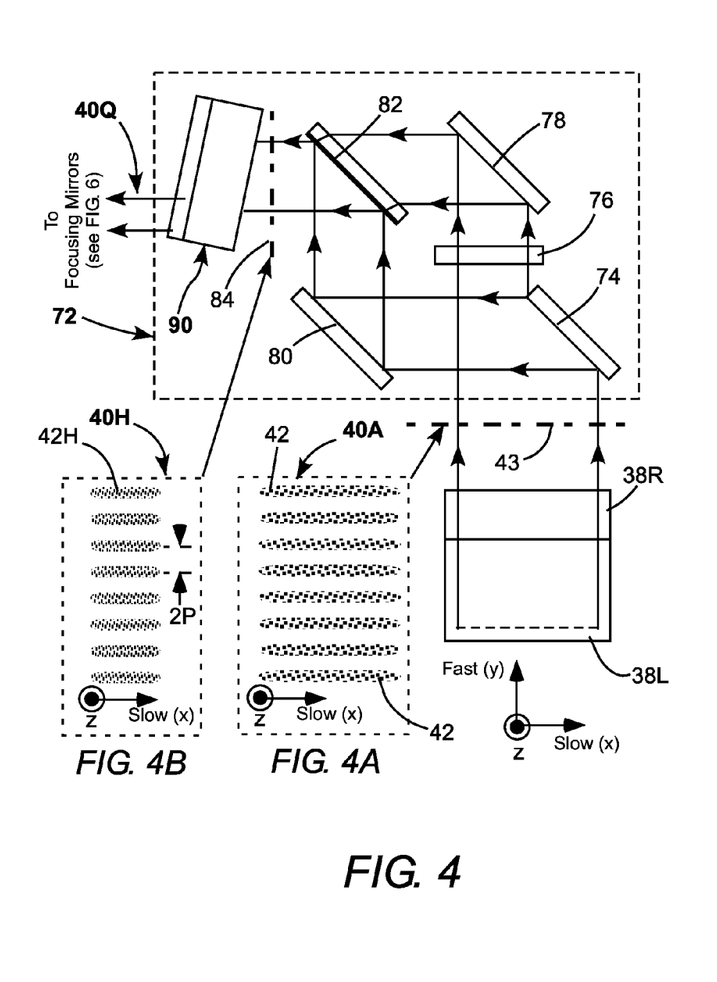
FIG. 4 is an end-elevation view seen generally in the direction 4-4 of FIG. 3 schematically illustrating details of the slow-axis beam-slicing and slow-axis recombination optics and the monolithic slow-axis beam-slicing and fast-axis interleaving element of FIG. 3.

FIG. 4 is an end-elevation view schematically illustration certain details of beam-slicing and interleaving unit 72. A cross-section of input-beam 40A at plane 43 is depicted in FIG. 4A. Beam 40A is incident on a turning-mirror 74, which intrudes half-way into the beam in the slow-axis. One half the width of the beam bypasses mirror 74 and the other half is reflected. The bypassed half of the beam is polarization-rotated through 90° by a half-wave plate 76, then turned by a turning-mirror 28 and transmitted by a polarization beam-combiner 82. The other half of beam 40A is reflected from turning-mirror 74 via another turning-mirror 80 to polarization beam-combiner 82 which reflects that half of beam 40A overlapping the transmitted half of beam 40A.

A result of this slicing and overlapping is that at a plane 84 there is a combined beam 40H having one-half the slow-axis width and the same fast-axis length of beam 40A. Because of the overlapping of the oppositely polarized halves of beam 40A, component-beams 42H of beam 40H are twice as bright as component-beams 42 of beam 40A. The beam in plane 84 is two-times brighter than in plane 43. Beam 40H is processed by an inventive beam-slicing and interleaving device 90, which slices the slow-axis width of component-beams of beam 40 into two half-widths, and interleaves the half-widths to form the sixteen-component beam 40Q depicted in cross section in FIG. 3. A detailed description of the manner in which this slicing and interleaving is accomplished is set forth below with reference to FIG. 5.

Figure 5:
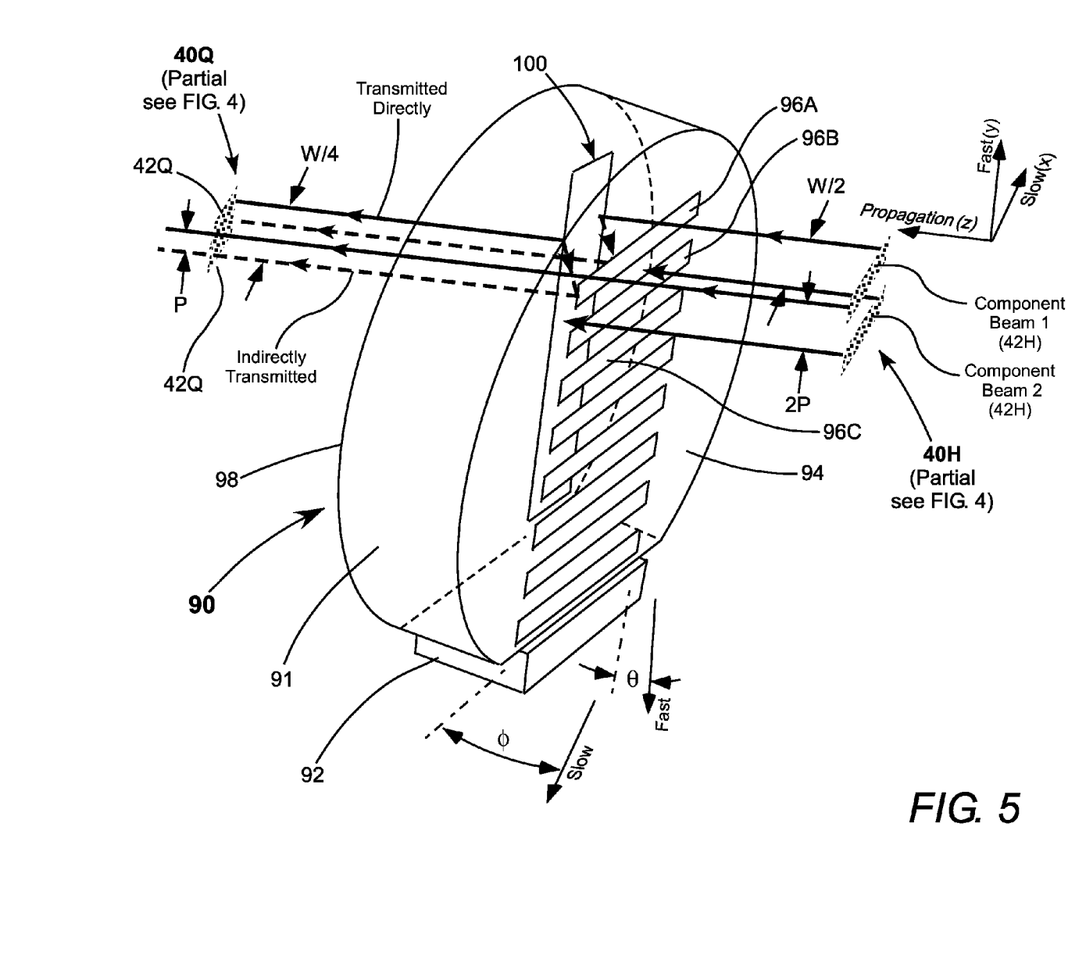
FIG. 5 is a three-dimensional view schematically illustrating further detail of the monolithic slow-axis beam-slicing and fast-axis interleaving element of FIG. 3.

Here, beam-slicing and interleaving device 90 includes a parallel-sided transparent substrate 91 mounted on a mounting pedestal 92. The parallel-sided plate is mounted at angle θ to the fast-axis and an angle φ to the slow-axis of input-beam 40H. On surface 94 of plate 91 are deposited eight fast-axis-spaced-apart reflective strips 96, with the top three thereof designated 96A, 96B and 96C, in order. The strips have fast-axis width, and spacing therebetween, about equal to the fast-axis height of component-beams 42H of combined-beam 40H. On surface 98 of plate 91 is deposited a reflective strip 100 having a length in the fast-axis direction of combined-beam 40H.

Device 90 is positioned with respect to beam 40 that component-beams of beam 40H, other than an uppermost one of the component beam (here, designated component beam 1) align with spaces between reflective strips 92, allowing the full width of component-beam 1 to be transmitted over strip 96A and the full width of all other component beams to be transmitted between the reflective strips. As depicted in FIG. 5, component beam 2 is transmitted between reflective strips 96A and 96B. Only two component beams are depicted for simplicity of illustration.

Device 90 is also positioned with respect to beam 40A such that reflective strip 90 intrudes half-way into the slow-axis width of the component beams transmitted through surface 94. This allows only one half-width of any component beam 42H to be transmitted directly through plate 91. Incident and directly transmitted beams are designated in FIG. 5 as bounded by bold solid lines.

The angles θ and φ are selected such the portions of a component-beam intercepted by strip 100 are reflected down by a distance P (one-half or 2P), and across by a distance W/4 (one-half the width W/2 of beam 40H). These reflected beam-portions are designated in FIG. 5 as being bounded by bold dashed lines. Each beam-portion reflected down and across intercepts a reflective strip 96 over which the corresponding full component-beam 42H has passed. The reflective strip directs the intercepted portion through surface 98 parallel to the corresponding directly transmitted portion and aligned in the slow-axis with the corresponding directly transmitted portion.

The directly-transmitted and indirectly transmitted (transmitted and reflected) portions 42Q of the component beam are spaced in the fast-axis direction by a distance P, such that the beam cross-sections are contiguous as depicted in FIG. 5. The directly transmitted portion of component-beam 2 is spaced apart from the indirectly transmitted portion of component-beam 1 also by an amount P. Taking into account all eight component-beams of beam 40H, this has the effect of "interleaving" indirectly directly transmitted component-beams 42Q with directly transmitted component beams 42Q, such that eight component-beams 42H having a slow-axis width W/2 and a fast-axis spacing 2P therebetween enter device 90, and sixteen component beams 42Q leave device 90 with a slow-axis width W/4 and fast-axis spacing P therebetween to provide the combined output-beam 40Q.

Figure 6:
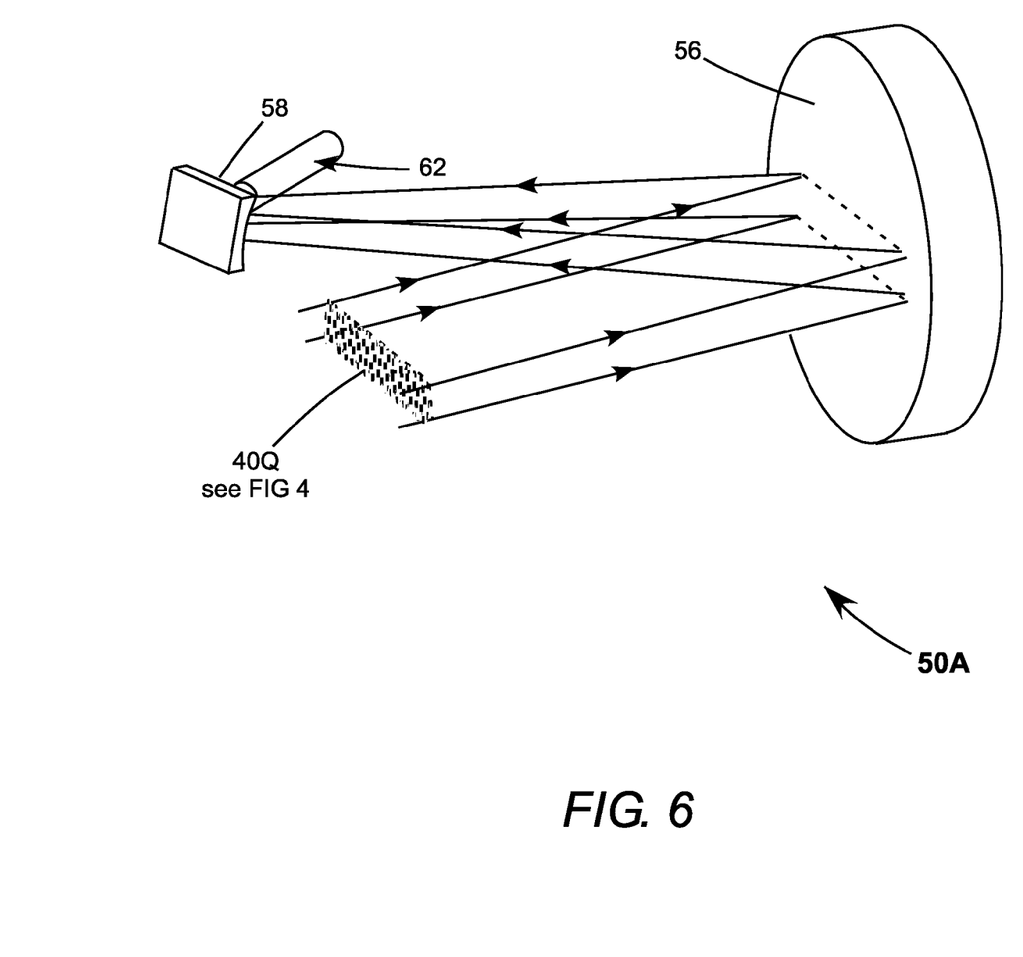
FIG. 6 is a three-dimensional view schematically illustrating another preferred embodiment of a light-source in accordance with the present invention utilizing the planar diode-laser bar array of FIG. 1, and the beam-slicing and recombination optics of FIG. 4 with focusing optics including a spherical concave mirror followed by a cylindrical concave mirror.

Beam 40Q is sent directly to anamorphic reflective focusing optics as depicted in FIG. 6. The reflective focusing optics are designated collectively by general reference numeral 50A, and are generally the same as optics 50 of FIG. 2, but without the slicing and recombining mirrors 52 and 54, which, of course, have been replaced by slicing and interleaving unit 72 of FIG. 4. Preferred focal lengths for mirrors 56 and 58 in arrangement 50A are 60 mm and 6 mm respectively with an axial spacing between the mirrors of about 54 mm.

Beam-slicing and interleaving unit 72 forms an output-beam having a slow-axis BPP that is 4-times less than that of the input-beam from the above described planar diode-laser bar array and a fast-axis BPP that is 2-times greater than of the input-beam. This provides, for the exemplified 8-component input-beam, for a more symmetric BPP at focus than is achieved by the beam-slicing and recombining arrangement of FIG. 2, which decreases the slow-axis BPP of the input-beam by a factor of 3 while increasing the fast-axis BPP by a factor of 3 providing less BPP symmetry at focus in the focusing optics. In this embodiment both the slow-axis BBP and the fast-axis BPP are smaller than in the arrangement of FIG. 2. This enables the combined beams to be focusing into 400-μm diameter fiber compared with 600 μm diameter fiber in the arrangement of FIG. 2. This reduction in BPP is due to the polarization combination step, which increases brightness.

The improved focusing ability is achieved at the expense of slightly more costly beam-slicing and recombining arrangements due in particular to the cost of the beam-slicing and interleaving device 90 and the need for a half-wave plate and polarization sensitive beam combiner beam-combiner.

In any of the above described configurations, light-sources in accordance with the present invention offer advantages over prior-art vertical diode-laser bar stack light-sources in two aspects. One aspect is the stacking of beams from diode-laser bar modules with spacing of the stacked beams independent of spacing of the diode-laser bar modules in the planar array. This provides for optimizing cooling of the diode-laser bar modules, and allows for relatively simple manufacturing (by using automated processes), testing and replacement of diode-laser bar modules in the array. Another aspect is the use of reflective optics rather than refractive optics for beam-shaping and focusing. Focusing-mirrors can be made nearly aberration-free, thereby eliminating the need for complex aspheric refractive elements. Reflective optics can handle high power without concern for bulk absorption.

It should be noted that a planar diode-laser bar array with an equal number of beams propagating in opposite directions to fast-axis stacking mirrors is preferred, for reasons discussed above. However, any one the above described slicing and recombination arrangements for slow-axis BPP reduction and fast-axis BPP increase can be used if all beams propagate in the same direction to a single fast-axis stacking mirror.

In conclusion, the present invention is described above in terms of a preferred and other embodiments. The invention is not limited, however, to the embodiments described and depicted herein. Rather the invention is limited only to the claims appended hereto.

What is claimed is:

1. An optical apparatus comprising:
   an optical fiber;
   a planar array of diode-laser-bar modules each thereof emitting a beam of laser-radiation, each of the beams characterized as having a fast-axis, a slow-axis, and a propagation-axis perpendicular to each other;
   a first plurality of turning-mirrors arranged to cause the beams from the diode-laser bars to propagate parallel to each other, aligned in the slow-axis direction, and spaced apart in the fast-axis direction to form a first combined beam having a fast-axis length and a slow-axis width;
   a second plurality of turning-mirrors arranged to divide the first combined beam into a plurality of beam-slices, each thereof having a slow-axis width less than that of the first combined beam, and add the beam-slices in the fast-axis direction to form a second combined beam having a slow-axis width less than that of the first combined beam; and
   anamorphic focusing optics arranged to focus the second combined beam into the optical fiber, the anamorphic focusing optics having optical power for the slow-axis direction greater than that for the fast-axis direction of the second combined beam.

2. The apparatus of claim 1, wherein the second plurality of mirrors is further arranged such that the second combined beam has a fast-axis length greater than that of the first combined beam.

3. The apparatus of claim 2, wherein there are eight diode-laser bar modules in the planar array thereof delivering a total of eight beams.

4. The apparatus of claim 3, wherein the first plurality of turning mirrors is arranged such that a first adjacent four of the eight beams propagates towards a second adjacent four of the eight beams before being combined into the first combined beam.

5. The apparatus of claim 2, wherein the second plurality of mirrors divides the beam into three about-equal slices and the second combined beam has a fast-axis length about three-times that of the first combined beam and a slow-axis width about one-third that of the first combined beam.

6. The apparatus of claim 1, wherein the anamorphic focusing optics includes a spherical mirror followed in the propagation direction of the second combined beam by a cylindrical mirror spaced apart from the spherical mirror, with the cylinder axis of the cylindrical mirror aligned with the fast-axis of the second combined beam, and with the cylindrical mirror having greater optical power in the fast axis that that of the spherical mirror.

7. The apparatus of claim 6, wherein the focal length of the spherical mirror and the spacing between the spherical mirror and the cylindrical mirror are selected such that the second combined beam has about equal fast-axis and slow-axis dimensions on the cylindrical mirror.

8. The apparatus of claim 1, wherein the fast-axis length of the second combined beam is about equal to that of the first combined beam.

9. The apparatus of claim 8, wherein the second plurality of turning mirrors is arranged to divide the first combined bean into two-slices and interleave the slices to form the second combined beam.

10. An optical apparatus comprising:
    an optical fiber;
    a heat-sink;
    first and second pluralities of diode-laser bars, each diode-laser bar characterized as having a fast-axis, a slow-axis, and a propagation-axis perpendicular to each other;
    the diode-laser bars being arranged spaced-apart on the heat-sink and aligned in the slow-axis direction, each diode-laser bar emitting a light-beam in the propagation-axis direction thereof;
    a first plurality of turning-mirrors arranged to receive the beams from the diode-laser bars and cause the beams from the first plurality of diode laser bars to counter-propagate toward beams from the second plurality of diode-laser bars;
    a second plurality of turning-mirrors arranged to receive the counter-propagating beams and cause the beams to co-propagate in the same direction parallel to each other and spaced-apart in the fast-axis direction as a first combined beam having a fast-axis dimension and a slow-axis dimension;
    a third plurality of turning-mirrors arranged to divide the first combined beam into a plurality of portions in the slow-axis and add the slow-axis portions in the fast-axis direction to form a second combined beam having a fast-axis dimension greater than and a slow-axis dimension less than those of the first combined beam; and
    anamorphic focusing optics arranged to focus the second combined beam into the optical fiber.

11. The apparatus of claim 10, wherein there are four diode-laser bars in each of the first and second pluralities thereof.

12. The apparatus of claim 10, wherein the third plurality of turning mirrors divides the first combined beam into three slow-axis portions and adds the slow-axis portions in the fast-axis direction to form a second combined beam having a fast-axis dimension about three-times greater than and a slow-axis dimension about three-times less than those of the first combined beam.

13. The apparatus of claim 10, wherein the anamorphic focusing optics includes a spherical mirror followed in the propagation direction of the second combined beam by a cylindrical mirror spaced apart from the spherical mirror, with the cylinder axis of the cylindrical mirror aligned with the fast-axis of the second combined beam, and with the cylindrical mirror having greater optical power in the fast axis that that of the spherical mirror.

14. The apparatus of claim 13, wherein the focal length of the spherical mirror and the spacing between the spherical mirror and the cylindrical mirror are selected such that the second combined beam has about equal fast-axis and slow-axis dimensions on the cylindrical mirror.

* * * * *